United States Patent
Hou et al.

(10) Patent No.: US 11,362,061 B2
(45) Date of Patent: Jun. 14, 2022

(54) METHOD FOR THE ELECTRICAL BONDING OF SEMICONDUCTOR COMPONENTS

(71) Applicants: IMEC vzw, Leuven (BE); Katholieke Universiteit Leuven, Leuven (BE)

(72) Inventors: Lin Hou, Brussels (BE); Jaber Derakhshandeh, Tienen (BE); Eric Beyne, Heverlee (BE); Ingrid De Wolf, Leuven (BE); Giovanni Capuz, Boutersem (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 76 days.

(21) Appl. No.: 16/906,387

(22) Filed: Jun. 19, 2020

(65) Prior Publication Data

US 2020/0402950 A1    Dec. 24, 2020

(30) Foreign Application Priority Data

Jun. 20, 2019   (EP) .................................... 19181468

(51) Int. Cl.
    *H01L 23/00* (2006.01)
(52) U.S. Cl.
    CPC .............. *H01L 24/83* (2013.01); *H01L 24/03* (2013.01); *H01L 24/05* (2013.01); *H01L 24/13* (2013.01);
    (Continued)
(58) Field of Classification Search
    CPC ...................................................... H01L 24/83
    See application file for complete search history.

(56) References Cited

U.S. PATENT DOCUMENTS

2009/0283906 A1   11/2009  Ohnishi
2011/0067908 A1    3/2011  Weichslberger et al.
(Continued)

FOREIGN PATENT DOCUMENTS

CN    102543784 A    7/2012
CN    104201123 A   12/2014
(Continued)

OTHER PUBLICATIONS

Chen et al., Effect of solder alloy composition on its solid-state bonding quality with Ni microcones, 2015 16th International Conference on Electronic Packaging Technology, 2015, pp. 1497-1500.
(Continued)

*Primary Examiner* — William A Harriston
(74) *Attorney, Agent, or Firm* — Knobbe, Martens, Olson & Bear, LLP

(57) ABSTRACT

A method is disclosed for electrically bonding a first semiconductor component to a second semiconductor component, both components including arrays of contact areas. In one aspect, prior to bonding, layers of an intermetallic compound are formed on the contact areas of the second component. The roughness of the intermetallic layers is such that the intermetallic layers include cavities suitable for insertion of a solder material in the cavities, under the application of a bonding pressure, when the solder is at a temperature below its melting temperature. The components are aligned and bonded, while the solder material is applied between the two. Bonding takes place at a temperature below the melting temperature of the solder. The bond can be established only by the insertion of the solder into the cavities of the intermetallic layers, and without the formation of a second intermetallic layer.

22 Claims, 3 Drawing Sheets

(52) U.S. Cl.
CPC .... H01L 24/16 (2013.01); *H01L 2224/03825* (2013.01); *H01L 2224/03848* (2013.01); *H01L 2224/05157* (2013.01); *H01L 2224/05551* (2013.01); *H01L 2224/05557* (2013.01); *H01L 2224/05573* (2013.01); *H01L 2224/05611* (2013.01); *H01L 2224/05657* (2013.01); *H01L 2224/13111* (2013.01); *H01L 2224/16145* (2013.01); *H01L 2224/81203* (2013.01); *H01L 2224/81345* (2013.01); *H01L 2224/81359* (2013.01); *H01L 2224/81898* (2013.01); *H01L 2924/01327* (2013.01)

(56) References Cited

U.S. PATENT DOCUMENTS

| | | | |
|---|---|---|---|
| 2011/0233792 A1* | 9/2011 | Zhang | H01L 24/81 257/778 |
| 2014/0054766 A1 | 2/2014 | Hashino et al. | |
| 2014/0015867 A1 | 6/2014 | Martinschitz et al. | |
| 2015/0061118 A1 | 3/2015 | Chen et al. | |
| 2016/0126216 A1 | 5/2016 | Heinrich et al. | |

FOREIGN PATENT DOCUMENTS

| | | |
|---|---|---|
| EP | 1732116 A2 | 12/2006 |
| WO | WO 2009/140709 A2 | 11/2009 |
| WO | WO 2010/031845 A1 | 3/2010 |

OTHER PUBLICATIONS

Chen et al., Low temperature bonding with metallic micro-cones for 3D integration, 2012 3rd IEEE International Workshop on Low Temperature Bonding for 3D Integration, p. 177.

Chen et al., Low-Temperature Solid State Bonding of Sn and Nickel Micro Cones for Micro Interconnection, ECS Solid State Letters, 2012, pp. 7-10.

Hu et al., Effects of Ni—W(Au) coated Cu microcones on the bonding interfaces, Applied Surface Science 353 (2015) 774-780.

Hu et al.; Electroless Silver Coating on Copper Microcones for Low-Temperature Solid State Bonding, Journal of Electronic Materials, vol. 44, No. 11, 2015, pp. 4516-4524.

Li et al., Solid-state Bonding Using Metallic Cone Layer for Interconnection, 2012 2nd IEEE CPMT Symposium Japan, in 5 pages.

Lu et al., Low-Temperature Bonding Method Based on Metallic Microcone Array for Interconnection Application, 2012 14th International Conference on Electronic Materials and Packaging (EMAP), in 4 pages.

Lu et al., Low-temperature solid state bonding method based on surface Cu—Ni alloying microcones, Applied Surface Science 268 (2013), pp. 368-372.

Extended European Search Report, dated Sep. 17, 2019, in EP Application No. 19181468.0.

* cited by examiner

METHOD FOR THE ELECTRICAL BONDING OF SEMICONDUCTOR COMPONENTS

CROSS-REFERENCE TO RELATED APPLICATIONS

This application claims foreign priority to European Patent Application No. 19181468.0, filed Jun. 20, 2019, the contents of which are incorporated by reference herein in its entirety.

BACKGROUND

Technological Field

The disclosed technology is related to electrical bonding of semiconductor components such as chips or wafers, in particular to 3D stacking methods involving fine-pitched solder joints.

Description of the Related Technology

The term "3D stacking" refers to techniques for producing a stack of two or more electrically interconnected semiconductor dies. Conventional thermal-compression bonding (TCB) for 3D interconnects often combines electroplated high melting point metal microbumps, such as bumps formed of Cu or Ni, with lower melting point solder metal like Sn. With a bonding temperature at or above the melting point of the solder, the liquid solder quickly reacts with the base metal to form an intermetallic compound joint. For Sn-based solder material, a bonding temperature higher than 250° C. is needed. However, temperature sensitive devices, such as advanced memories and image sensors require low temperatures for 3D stacking to increase the capacity of memory and the resolution and quality of images.

Especially for die-to-wafer stacking, and because of the full cycle TCB applied for each die, the throughput that can be achieved by thermal compression bonding is becoming too low to meet the present industry's requirements. The high temperature cycles are also a risk in terms of the oxidation of the microbumps of neighboring dies in a die-to-wafer bonding process.

Low temperature solutions have been explored, and include the use of alternative solder materials such as indium-based solder, but these alternatives have not been able to match Sn-based solder in terms of the reliability of the bond. Another approach is the use of a sharp microcone structure on the microbumps to achieve a mechanical interlocking between the microcones and a solder material inserted therein, as described for example in the article "Effect of solder alloy composition on its solid-state bonding quality with Ni microcones" by Zhuo Chen et al., 2015 16th International Conference on Electronic Packaging Technology. The production of Ni or Cu microcones however requires carefully controlled electroplating conditions. Also, the throughput achievable with this approach is still rather low. The above-cited document reports a bonding time of 60 s for example.

International Patent Publication No. WO2010/031845 describes a method wherein a brittle intermetallic layer is formed on the microbumps of one of the dies which are to be bonded, the intermetallic having a high roughness so that it breaks upon contacting a solder material applied to the microbumps of the other die. Bonding takes place at a temperature below the melting temperature of the solder, but high enough so that the solder is sufficiently soft to enter cavities defined by the roughness of the intermetallic layer, when a bonding pressure is applied. A second intermetallic layer is then formed at the interface between the solder material and the first intermetallic layer. Whereas the latter document includes examples of a bonding process taking place at temperatures below 150° C., the bonding time is consistently high, in the order of 10 minutes or more. This is inconsistent with the industry's present-day throughput requirements.

SUMMARY OF CERTAIN INVENTIVE ASPECTS

Various aspects of the disclosed technology provide a method for bonding semiconductor components which does not suffer from the above-described drawbacks. A technological improvement is achieved by the methods as disclosed herein.

The disclosed technology is related to a method for electrically bonding a first semiconductor component to a second semiconductor component, both components including arrays of contact areas. Prior to bonding, a layer of an intermetallic compound is formed on each of the contact areas of the second component. The roughness of the intermetallic layer is such that the intermetallic layer includes cavities suitable for insertion of a solder material in the cavities, under the application of a bonding pressure, when the solder is at a temperature below its melting temperature. The method includes the alignment and bonding of the components, while the solder material is applied between the two. Bonding takes place at a bonding temperature below the melting temperature of the solder and under the application of a bonding pressure. According to the disclosed technology, the bond is established only by the insertion of the solder into the cavities of the intermetallic layers, and without the formation of a second intermetallic layer.

This allows to realize a strong bond in a significantly shorter bonding time compared to prior art methods. Stated in another way, the bonding time is chosen so that essentially no second intermetallic is formed during the bonding time. Despite this short bonding time, the obtained bond has the same or better bond strength and electrical characteristics compared to prior art methods. The realization of the strong bond by no other means than the mechanical insertion of the solder into the cavities may be facilitated by certain characteristics of the morphology of the intermetallic layer.

The disclosed technology is in particular related to a method for bonding a first semiconductor component to a second semiconductor component, wherein both components include an array of contact areas, which are to be bonded together to form electrical connections, and wherein:
  the contact areas of the first component include at least an upper layer formed of a first contact metal,
  the contact areas of the second component include at least an upper layer formed of a second contact metal which may be the same or different than the first contact metal,
  on the contact areas of the second component, respective intermetallic layers are provided, formed of an intermetallic compound, wherein the roughness of the intermetallic layers is such that the intermetallic layers include cavities suitable for insertion of a solder material in the cavities, under the application of a bonding pressure, when the solder is at a temperature below its melting temperature, and wherein the method includes:
  applying a bump of the solder material to each of the contact areas of the first component,
  aligning the array of contact areas of the first component to the array of contact areas of the second component, the array of contact areas of the second component being provided with the intermetallic layers,
  bonding the first component to the second component under the application of a bonding pressure, at a bonding temperature below the melting temperature of the solder, thereby realizing the insertion of the solder material into the cavities of the intermetallic layers, wherein the bonding pressure and temperature are applied during a bonding time,
  wherein the bond is established only by the insertion of the solder material into the cavities, and without the formation of a second intermetallic layer during the bonding time.

According to an embodiment, the solder material is a metal and the intermetallic compound includes or consists of the contact metal of the second component and the solder.

According to an embodiment, the method for forming the intermetallic layers on the contact areas of the second component includes:
  providing the second component,
  applying on the upper layers of the contact areas of the second component, the upper layers being formed of the second contact metal, a layer of a third metal that is different from the second contact metal, and
  annealing the second component to thereby form the intermetallic layers by interdiffusion of the third metal and the second contact metal.

According to an embodiment, the solder material is a metal, and the third metal is the same as the solder metal.

The bonding time may be less than 10 seconds, more preferably less than 5 seconds.

According to an embodiment, the intermetallic layers are characterized by plate-shaped grains having a length, and the average length of the grains of the intermetallic layer is between 0.5 µm (micrometer) and 2 µm (micrometer).

According to an embodiment, the skewness of the intermetallic layers is positive, and the normalized volume of the intermetallic layers is between 0.3 µm$^3$/mm$^2$ (cubic micrometer per square millimeter) and 0.8 µm$^3$/mm$^2$.

According to an embodiment, the contact metal on the second component is cobalt, the solder material is Sn and the intermetallic compound is $CoSn_3$.

In the case where the contact metal on the second component is cobalt, the solder material is Sn, and the intermetallic compound is $CoSn_3$, the intermetallic layers may be formed as described above, and the annealing step may be performed at a temperature between 150° C. and 270° C.

In the case of the intermetallic compound being $CoSn_3$, the bonding time may be about 2 seconds, the bonding temperature about 150° C. and the bonding pressure about 46 MPa.

According to an embodiment, the intermetallic layers are applied equally to additional contact areas of the second component and the intermetallic layers are passivation layers which protect the additional contact areas from oxidation during the bonding step.

DETAILED DESCRIPTION OF CERTAIN ILLUSTRATIVE EMBODIMENTS

Figure 1A:
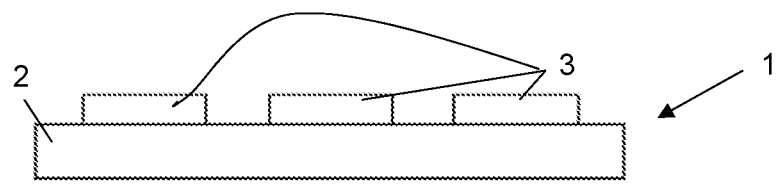
FIGS. 1A through 1G illustrate the method of the present disclosure according to one embodiment.
Figure 1B:
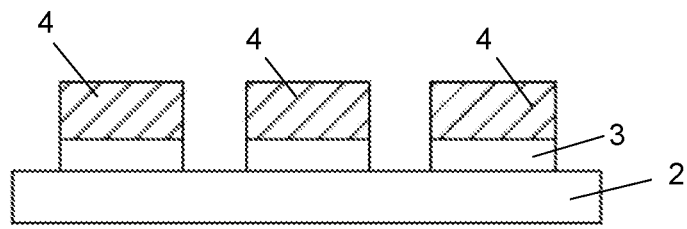

The present disclosure will be described on the basis of an example embodiment(s), which is not intended to limit the scope of the present disclosure. The embodiment concerns the formation of a bond using Sn as the solder, Co as the contact metal on the first and the second component, and $CoSn_3$ as the intermetallic compound formed on the second component prior to bonding. The $CoSn_3$ intermetallic may be formed by annealing of the second component, after application of a Sn layer on the Co contact areas of the second component. This method is illustrated in FIGS. 1A to 1D. In FIG. 1A, the first component 1 is shown, which may be a silicon die 2 including an array of contact areas 3. At least the upper layer of the contact areas 3 is formed by patches of Co having a thickness in the order of several micrometers, for example 5 micrometers. Sn solder bumps 4 are applied to the contact areas 3, as shown in FIG. 1B. The bumps 4 may be produced by electroplating. The thickness of the solder bumps 4 may be applied using any suitable methods, for example in the order of 4 to 7 micrometers.

Figure 1C:
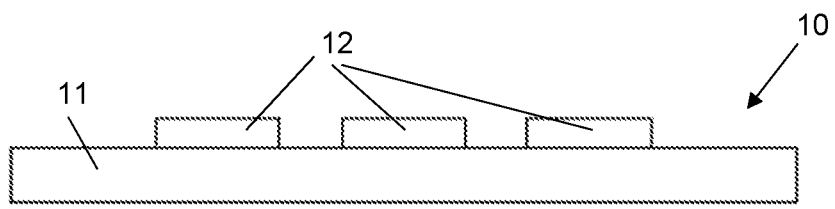
Figure 1D:
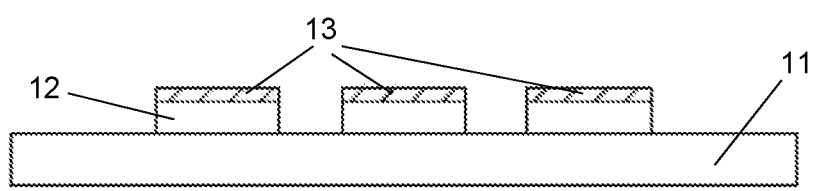

As seen in FIG. 1C, the second component 10 may be a silicon wafer 11 including an array of contact areas 12 being similar in size and thickness to the contact areas 3 on the first component 1, and spaced apart at the same distances than the contact areas 3 on the first component. The contact areas 12 also include at least an upper layer of Co having a thickness in the order of micrometers. As shown in FIG. 1D, a thin layer 13 of Sn is deposited on the Co upper layers of the contact areas 12 of the second component, for example by electroplating. The thickness of the Sn layer 13 is preferably in the order of 500 to 1000 nm, but other thicknesses can be suitably implemented.

Figure 1E:
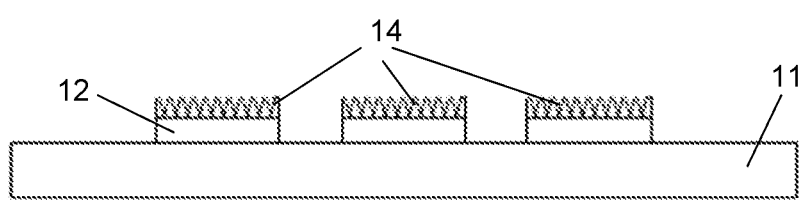

The second component 10 is then subjected to a thermal treatment, by maintaining the component at an annealing temperature during a given timespan, the result of which is illustrated in FIG. 1E. The annealing temperature is preferably in the range between 150° C. and 270° C., but other temperatures can be suitably implemented. Under the influence of the elevated temperature, interdiffusion of Co and Sn takes place and a layer 14 of the intermetallic compound $CoSn_3$ is formed on each of the contact areas 12. The intermetallic layer 14 is symbolically drawn with visible peaks and valleys to indicate that it is a layer with a high roughness. According to some embodiments, the RMS roughness is about 250 nm or more when the thermal treatment is performed at an annealing temperature in the lower end of the 150-270° C. range, to about 450 nm or more for an annealing temperature in the higher end of the range. The peak-to-valley height of the intermetallic layer 14 is between 1 micrometer and 2 micrometer or more, also as a function of increasing annealing temperatures within the range 150-270° C. The anneal times decrease for increasing temperatures, from several hours (e.g., 3 hours) at 150° C., to about one minute at 270° C.

The Sn layers 3 are essentially fully consumed during the formation of the intermetallic layers 14 while the thickness of the Co patches in the contact areas 12 is reduced very little. The thickness reduction ratio to form the $CoSn_3$ for Co and Sn solder is 0.14 and 0.97 respectively, based on the density and molar volumes of each phase. The high thickness reduction ratio of Sn solder and low thickness reduction ratio of Co enables the full formation of CoSn$_3$ with limited Co thickness reduction.

Figure 1F:
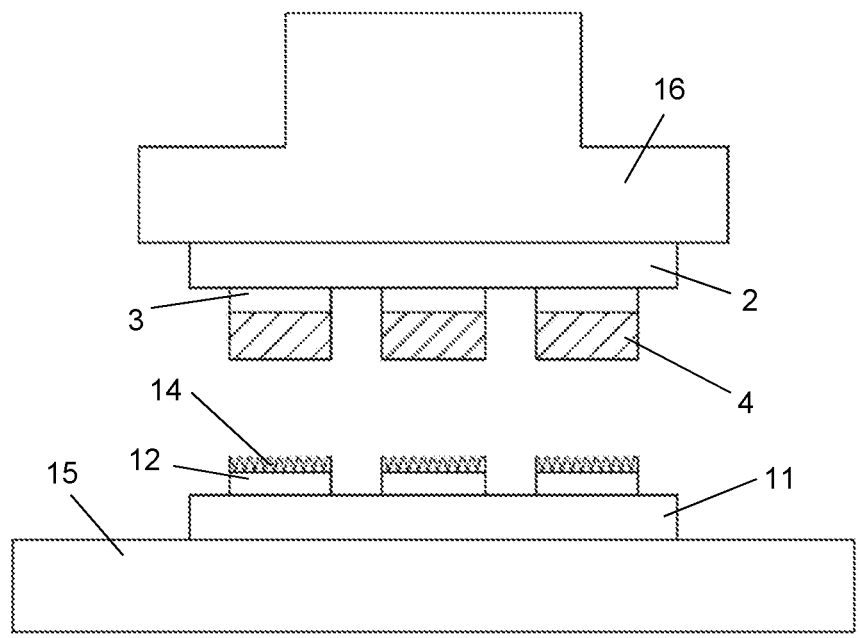
Figure 1G:
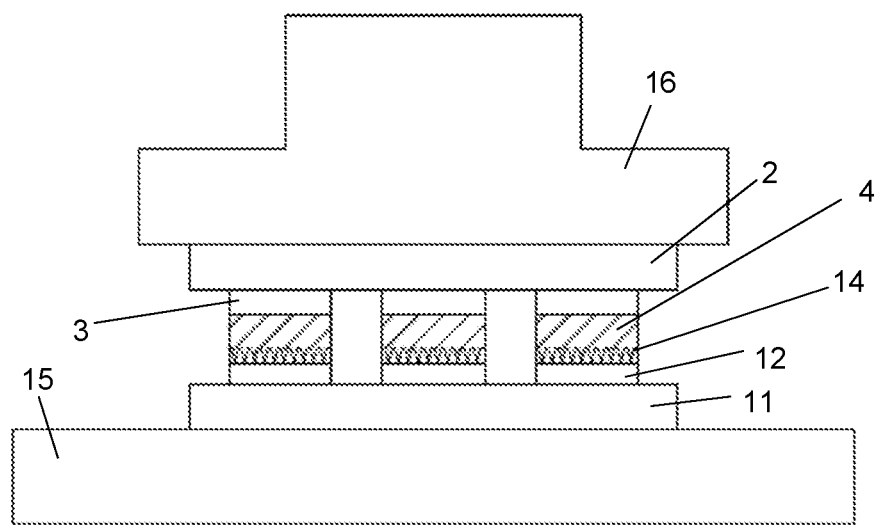

Reference is then made to FIG. 1F. The second component 10 is attached to a chuck 15. By a bonding tool 16 or any suitable tool, the first component 1 is then bonded to the second component 10. The arrays of contact areas 3 and 12 on the first and second component are aligned, and the solder bumps 4 on the first component 1 are brought into physical contact with the intermetallic layers 14 of the second component 10, at an elevated bonding temperature and under the application of a bonding pressure. The bonding temperature is lower than the melting temperature of the solder (231° C. in the case of Sn), but high enough to soften the solder so that the solder is inserted into the cavities formed by the roughness of the intermetallic layer 14. Preferred bonding temperatures applied in the method of the present disclosure are lower than 150° C., more preferably between 100 and 150° C., more preferably between 100° C. and a temperature lower than 130° C. The bonding pressure applied may be comparable to the bonding pressure applied in prior art methods, for example between 20 and 80 MPa.

The bonding time applied in the method of the present disclosure (i.e., the timespan during which the bonding pressure and bonding temperature are applied), is significantly shorter than in prior art methods. In the case of the Co/Sn bond described above, a strong bond is established after bonding times in the order of seconds, for example 2 seconds for each die. During this time, substantially no chemical reaction takes place between the solder bumps 4 and the intermetallic layers 14, i.e., no second intermetallic is formed, and the bond is established only by the mechanical insertion of the softened solder into the cavities of the intermetallic layers 14. By applying the above-described Co/Sn bonding method according to the present disclosure, die shear strengths are obtainable between 10 and 20 MPa.

Without being bound by any particular theory, it is believed that the realization of a strong bond in a short bonding time is at least partly enabled by the morphology of the intermetallic layers 14. The grains of the CoSn$_3$ layers 14 are shaped as elongate plates defined by the length of the grains, measurable on a microscopic image of the intermetallic layers. For the CoSn$_3$ intermetallic layers 14, the inventors of the present disclosure recorded an average grain length in the order of 1 micrometer. A higher average grain length, about 1.4 micrometer was measured for the CoSn$_3$ intermetallic layers obtained at the higher annealing temperature of 270° C., while an average grain length of about 1 micrometer was measured for the lower annealing temperature of 150° C. According to some embodiments of the present disclosure, the morphology of the intermetallic layer 14 is defined by plate-shaped grains defined by an average grain length between 0.5 and 2 micrometer. According to further embodiments, the average grain length is between 0.7 and 1.8 micrometer, and between 0.9 and 1.5 micrometer.

Figure 2:
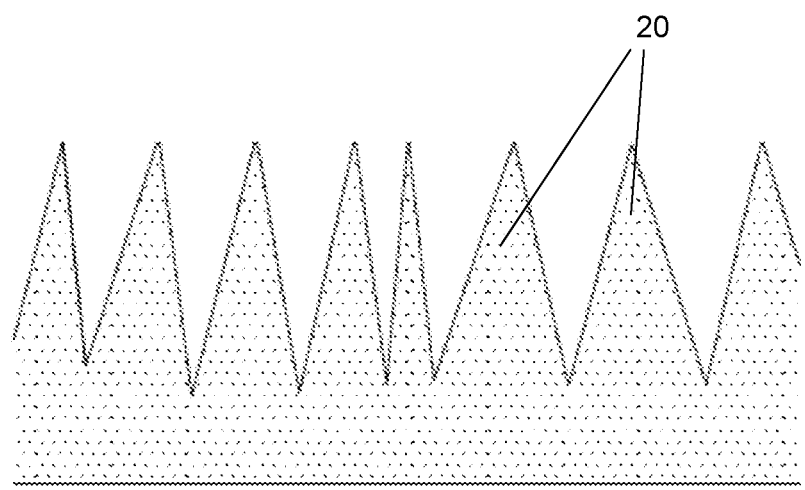
FIG. 2 illustrates an example morphology of the intermetallic layer produced in accordance with the present disclosure.

Also, the morphology of the intermetallic CoSn$_3$ is characterized by a surface aspect illustrated in FIG. 2. The skewness of the surface is positive. The inventors measured the normalized volume of the CoSn$_3$ intermetallic layer. The normalized volume is the ratio of the volume of the peaks 20 on a given surface area, to the surface area. Normalized volume is expressed in cubic micrometers/square millimeter ($\mu m^3/mm^2$). See below for a description of the measurement and results. According to one embodiment, the morphology of the intermetallic layer 14 is defined by a positive skewness, and by a normalized volume between 0.3 $\mu m^3/mm^2$ and 0.8 $\mu m^3/mm^2$.

The short bonding time and low bonding temperatures which are applicable in the method of the present disclosure are advantageous also in terms of protecting the contact areas of neighboring dies against oxidation. According to some embodiments, the intermetallic layer 14 is itself a passivation layer that protects these neighboring contacts from oxidation. This is the case in particular for CoSn$_3$. It is therefore advantageous in this case to produce the intermetallic layer 14 on a plurality of arrays of contact areas 12 on the second component, prior to bonding multiple dies sequentially to the plurality of arrays.

The method is not limited to the application of the above-named materials Co and Sn. The solder could be another material than the contact metals of the contact areas 3 and 12 of the respective components 1 and 10. These latter contact metals could be different from each other. In the above-described thermal treatment for obtaining the intermetallic layers 14, the layer 13 applied to the contact areas 12 of the second component could be formed of a metal that is different from the solder material. The method for obtaining the intermetallic layers 14 could be different from the above-described thermal treatment. The intermetallic layers 14 could be deposited on the contact areas 12, for example by sputtering. The intermetallic layers could be deposited directly on the contact areas 12 or one or more intermediate layers may be deposited first, for example an adhesion layer for improving the adhesion of the intermetallic layers 14 to the contact areas 12.

After realizing the bond by any of the methods described above, an underfill material may be added to be assembly of the bonded components, in any suitable manner.

Experimental Results

A first and second chip were provided, each having arrays of Co-microcontacts with a pitch of about 20 micrometers. A Sn solder material bump of about 5 $\mu m$ was deposited on the Co contacts of the first chip by electroplating and a thin Sn layer (about 1 micrometer thick) was deposited on the Co contacts of the second chip. The thin Sn layer reacted with the Co contact areas to form an intermetallic layer at 270° C. within 1 minute. Then the two chips were placed face-to-face and bonded at about 150° C. with a pressure of 46 MPa. The bonding time was 2 seconds. After bonding, the cross-section of the bonded interface was studied by scanning electron microscopy and electrical connection of daisy chains with 800 fine pitch microbumps were carried out in order to investigate the bonding yield and quality of fine pitch solder joint. More than 90% electrical yield was obtained. From the cross-section SEM images, it was found that the Co/Sn intermetallic was successfully bonded to the Sn solder and there were essentially no voids or seams between them. The die shear strength was determined to be about 17 MPa.

The normalized volume was measured on CoSn$_3$ intermetallic layers obtained at annealing temperatures of 150° C. and 270° C. The measurement was derived from a 3D image of the surface roughness of the respective samples on a scale that allows to visualize the peaks shown in FIG. 2. The image was obtained using optical profiling. An optical profiling tool provides a very detailed image of the three-dimensional surface topography by combining an interferometer and a microscope. An interferometer is an optical device that divides a beam of light exiting a single source (like a laser) into two beams and then recombines them to create an interference pattern. Combined with the microscope, optical profiling can offer a 3D surface topography phase map. The tool used for the measurements on the $CoSn_3$ intermetallic layer was the Veeco Wyko® NT3300™ optical 3D profiling system. All measurements were done in VSI mode (Vertical Scanning interferometry). VSI uses a white light source and is used to characterize relatively rough surfaces (Ra greater than 0.1 mm) or surfaces with discontinuities on steps greater than 160 nm (¼). The measurement range is 2 mm. VSI is accurate down to a few nanometers, making the method well-suited for applications in MEMS and semiconductor measurements. During the measurement, the system moves vertically to scan the surface at varying heights and an interference signal for each point on the surface is recorded. The measured area was 60 micrometer by 50 micrometer with spatial resolution 0.08*0.05 micrometer. The vertical resolution was 3 nm. The normalized volume was directly read out from the Veeco analysis software once the measurement was finished. Measurements were performed at 4 positions, and averaged out. The results are summarized in the following table.

| Intermetallic formed at 150° C. | Normalized volume $\mu m^3/mm^2$ | Intermetallic formed at 270° C. | Normalized volume $\mu m^3/mm^2$ |
|---|---|---|---|
| Pos 1 | 0.45 | Pos 1 | 0.69 |
| Pos 2 | 0.39 | Pos 2 | 0.80 |
| Pos 3 | 0.42 | Pos 3 | 0.71 |
| Pos 4 | 0.45 | Pos 4 | 0.75 |
| Average value | 0.43 ± 0.03 | Average value | 0.74 ± 0.05 |

While the disclosed technology has been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. A method of bonding a first semiconductor component to a second semiconductor component, wherein both components comprise an array of contact areas, which are to be bonded together to form electrical connections, and wherein:
the contact areas of the first component comprise at least an upper layer formed of a first contact metal,
the contact areas of the second component comprise at least an upper layer formed of a second contact metal which may be the same or different than the first contact metal,
on the contact areas of the second component, respective intermetallic layers are provided, formed of an intermetallic compound, wherein the roughness of the intermetallic layers is such that the intermetallic layers comprise cavities suitable for insertion of a solder material in the cavities, under the application of a bonding pressure, when the solder is at a temperature below its melting temperature,
the method comprising:
forming the intermetallic layers on the contact areas of the second component;
applying a bump of the solder material to each of the contact areas of the first component;
aligning the array of contact areas of the first component to the array of contact areas of the second component, the array of contact areas of the second component being provided with the intermetallic layers; and
bonding the first component to the second component under the application of a bonding pressure, at a bonding temperature below the melting temperature of the solder, thereby realizing the insertion of the solder material into the cavities of the intermetallic layers, wherein the bonding pressure and temperature are applied during a bonding time,
wherein the bond is established only by the insertion of the solder material into the cavities, and without the formation of a second intermetallic layer during the bonding time, and
wherein forming the intermetallic layers comprises:
providing the second component;
applying on the upper layers of the contact areas of the second component a layer of a third metal that is different from the second contact metal, the upper layers of the contact areas being formed of the second contact metal; and
annealing the second component to thereby form the intermetallic layers by interdiffusion of the third metal and the second contact metal.

2. The method according to claim 1, wherein the solder material is a metal and wherein the intermetallic compound comprises the second contact metal of the second component and the solder.

3. The method according to claim 1, wherein the solder material is a metal, and wherein the third metal is the same as the solder metal.

4. The method according to claim 1, wherein the bonding time is less than 10 seconds.

5. The method according to claim 1, wherein the intermetallic layers are characterized by plate-shaped grains having a length, and wherein the average length of the grains of the intermetallic layer is between 0.5 μm and 2 μm.

6. The method according to claim 1, wherein the skewness of the intermetallic layers is positive, and wherein the normalized volume of the intermetallic layers is between 0.3 $\mu m^3/mm^2$ and 0.8 $\mu m^3/mm^2$.

7. The method according to claim 1, wherein the contact metal on the second component is cobalt, the solder material is Sn and the intermetallic compound is $CoSn_3$.

8. The method according to claim 7, wherein the bonding time is about 2 seconds, the bonding temperature is about 150° C. and the bonding pressure is about 46 MPa.

9. The method according to claim 7, wherein the third metal is the same as the solder metal.

10. The method according to claim 1, wherein the contact metal on the second component is cobalt, the solder material is Sn, and the intermetallic compound is $CoSn_3$, and wherein annealing is performed at a temperature between 150° C. and 270° C.

11. The method according to claim 1, wherein the intermetallic layers are applied equally to additional contact areas of the second component, and wherein the intermetallic layers are passivation layers which protect the additional contact areas from oxidation during bonding.

12. The method according to claim 1, wherein the bonding time is less than 10 seconds.

13. The method according to claim 12, wherein the intermetallic layers are characterized by plate-shaped grains having a length, and wherein the average length of the grains of the intermetallic layer is between 0.5 μm and 2 μm.

14. The method according to claim 13, wherein the skewness of the intermetallic layers is positive, and wherein the normalized volume of the intermetallic layers is between 0.3 μm$^3$/mm$^2$ and 0.8 μm$^3$/mm$^2$.

15. The method according to claim 14, wherein the contact metal on the second component is cobalt, the solder material is Sn and the intermetallic compound is CoSn$_3$.

16. A method of bonding a first semiconductor component to a second semiconductor component, wherein both components comprise an array of contact areas, which are to be bonded together to form electrical connections, and wherein:
the contact areas of the first component comprise at least an upper layer formed of a first contact metal,
the contact areas of the second component comprise at least an upper layer formed of a second contact metal which may be the same or different than the first contact metal,
on the contact areas of the second component, respective intermetallic layers are provided, formed of an intermetallic compound, wherein the roughness of the intermetallic layers is such that the intermetallic layers comprise cavities suitable for insertion of a solder material in the cavities, under the application of a bonding pressure, when the solder is at a temperature below its melting temperature,
the method comprising:
applying a bump of the solder material to each of the contact areas of the first component;
aligning the array of contact areas of the first component to the array of contact areas of the second component, the array of contact areas of the second component being provided with the intermetallic layers; and
bonding the first component to the second component under the application of a bonding pressure, at a bonding temperature below the melting temperature of the solder, thereby realizing the insertion of the solder material into the cavities of the intermetallic layers, wherein the bonding pressure and temperature are applied during a bonding time,
wherein the bond is established only by the insertion of the solder material into the cavities, and without the formation of a second intermetallic layer during the bonding time, wherein the intermetallic layers are characterized by plate-shaped grains having a length, and wherein the average length of the grains of the intermetallic layer is between 0.5 μm and 2 μm.

17. The method according to claim 16, wherein the bonding time is less than 10 seconds.

18. The method according to claim 16, wherein the skewness of the intermetallic layers is positive, and wherein the normalized volume of the intermetallic layers is between 0.3 μm$^3$/mm$^2$ and 0.8 μm$^3$/mm$^2$.

19. The method according to claim 16, wherein the contact metal on the second component is cobalt, the solder material is Sn and the intermetallic compound is CoSn$_3$.

20. A method of bonding a first semiconductor component to a second semiconductor component, wherein both components comprise an array of contact areas, which are to be bonded together to form electrical connections, and wherein:
the contact areas of the first component comprise at least an upper layer formed of a first contact metal,
the contact areas of the second component comprise at least an upper layer formed of a second contact metal which may be the same or different than the first contact metal,
on the contact areas of the second component, respective intermetallic layers are provided, formed of an intermetallic compound, wherein the roughness of the intermetallic layers is such that the intermetallic layers comprise cavities suitable for insertion of a solder material in the cavities, under the application of a bonding pressure, when the solder is at a temperature below its melting temperature,
the method comprising:
applying a bump of the solder material to each of the contact areas of the first component;
aligning the array of contact areas of the first component to the array of contact areas of the second component, the array of contact areas of the second component being provided with the intermetallic layers; and
bonding the first component to the second component under the application of a bonding pressure, at a bonding temperature below the melting temperature of the solder, thereby realizing the insertion of the solder material into the cavities of the intermetallic layers, wherein the bonding pressure and temperature are applied during a bonding time,
wherein the bond is established only by the insertion of the solder material into the cavities, and without the formation of a second intermetallic layer during the bonding time, wherein the skewness of the intermetallic layers is positive, and wherein the normalized volume of the intermetallic layers is between 0.3 μm$^3$/mm$^2$ and 0.8 μm$^3$/mm$^2$.

21. The method according to claim 20, wherein the bonding time is less than 10 seconds.

22. The method according to claim 20, wherein the contact metal on the second component is cobalt, the solder material is Sn and the intermetallic compound is CoSn$_3$.

* * * * *